(12) United States Patent
Desai et al.

(10) Patent No.: US 12,742,801 B2
(45) Date of Patent: Sep. 22, 2026

(54) CURRENT SENSING IN NON-CMOS SEMICONDUCTOR TECHNOLOGY FOR POWER CONVERSION APPLICATIONS

(71) Applicant: Intel Corporation, Santa Clara, CA (US)

(72) Inventors: Nachiket Desai, Portland, OR (US); Harish K. Krishnamurthy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 360 days.

(21) Appl. No.: 17/727,153

(22) Filed: Apr. 22, 2022

(65) Prior Publication Data

US 2023/0341444 A1 Oct. 26, 2023

(51) Int. Cl.
*G01R 19/25* (2006.01)
*H10D 30/69* (2025.01)

(52) U.S. Cl.
CPC ....... *G01R 19/2513* (2013.01); *H10D 30/721* (2025.01)

(58) Field of Classification Search
CPC ............ G01R 19/2513; G01R 19/0092; H10D 30/721; H02M 3/01; H02M 3/158; H02M 1/0009
See application file for complete search history.

(56) References Cited

U.S. PATENT DOCUMENTS

| | | | | |
|---|---|---|---|---|
| 6,414,404 | B1 * | 7/2002 | Allen | H10D 30/668 307/130 |
| 9,172,237 | B2 * | 10/2015 | Sato | H10D 86/423 |
| 2016/0124455 | A1 * | 5/2016 | Sambucco | G05F 3/267 323/315 |
| 2017/0089957 | A1 * | 3/2017 | Takada | H10D 30/669 |
| 2019/0140630 | A1 * | 5/2019 | Chen | H03K 17/08104 |
| 2023/0369974 | A1 * | 11/2023 | Corbishley | H02M 3/06 |

* cited by examiner

*Primary Examiner* — Lee E Rodak
*Assistant Examiner* — Zannatul Ferdous
(74) *Attorney, Agent, or Firm* — NICHOLSON DE VOS WEBSTER & ELLIOTT LLP

(57) ABSTRACT

Embodiments herein relate to a current sensor for a power converter such as a buck converter. The power converter is fabricated on a high bandgap semiconductor die while the current sensor includes a portion on the same die and a portion on a silicon die. The portion on the same die includes a sense transistor, while the portion on the silicon die includes a feedback circuit for controlling a voltage of the sense transistor to ensure it is biased according to the bias of a switching transistor of the power converter. A current of the sense transistor can then be processed such as by an averaging or sampling process.

19 Claims, 8 Drawing Sheets

CURRENT SENSING IN NON-CMOS SEMICONDUCTOR TECHNOLOGY FOR POWER CONVERSION APPLICATIONS

FIELD

The present application generally relates to the field of power converters, and more particularly, to sensing a current in a power converter.

BACKGROUND

Power converters are commonly used in electronic devices. One example is a buck converter, also known as a step down converter. This is a direct current (DC)-to-DC power converter which steps down an input voltage such as 12 V to a lower output voltage such as 1.8, 3.3 or 5 V. Such a converter may be used in a computing device, for example, to step down the main power supply to lower voltages which are suitable for Universal Serial Bus (USB) devices, dynamic random access memory (DRAM) and a central processing unit (CPU). However, various challenges are presented in implementing a power converter.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
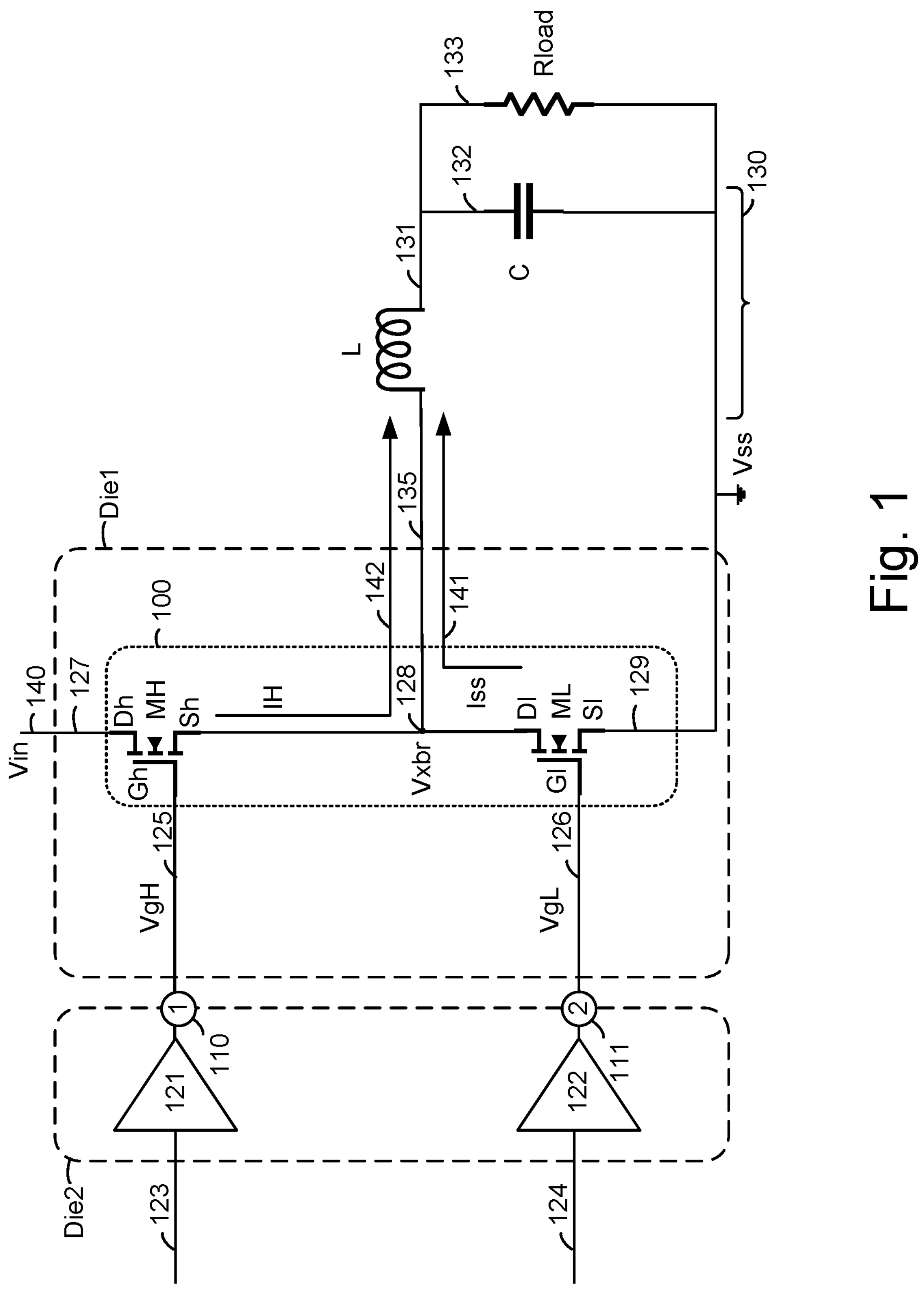
FIG. 1 depicts an example implementation of a power converter 100 on a first die, Die1, which is driven by gate drivers 121 and 122 on a second die, Die2, in accordance with various embodiments.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms “substantially,” “close,” “approximately,” “near,” and “about,” generally refer to being within +/−10% of a target value. Unless otherwise specified the use of the ordinal adjectives “first,” “second,” and “third,” etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases “A and/or B” and “A or B” mean (A), (B), or (A and B). For the purposes of the present disclosure, the phrase “A, B, and/or C” means (A), (B), (C), (A and B), (A and C), (B and C), or (A, B, and C).

The description may use the phrases “in an embodiment,” or “in embodiments,” which may each refer to one or more of the same or different embodiments. Furthermore, the terms “comprising,” “including,” “having,” and the like, as used with respect to embodiments of the present disclosure, are synonymous.

As used herein, the term “circuitry” may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

The terms "coupled," "communicatively coupled," along with derivatives thereof are used herein. The term "coupled" may mean two or more elements are in direct physical or electrical contact with one another, may mean that two or more elements indirectly contact each other but still cooperate or interact with each other, and/or may mean that one or more other elements are coupled or connected between the elements that are said to be coupled with each other. The term "directly coupled" may mean that two or more elements are in direct contact with one another. The term "communicatively coupled" may mean that two or more elements may be in contact with one another by a means of communication including through a wire or other interconnect connection, through a wireless communication channel or link, and/or the like.

As mentioned at the outset, various challenges are presented in implementing a power converter. One challenge is that a power converter may be implemented on a die which is incompatible with Complementary Metal-Oxide-Semiconductor (CMOS) logic circuits. For example, a die comprising a high bandgap compound semiconductor has a number of advantages when designing a power converter, including reduced temperature effects and better heat dissipation. Other benefits can include improved efficiency, switching speed, reliability, reduced size, and the ability to operate at higher voltages, power levels and frequencies. Example high bandgap compound semiconductors and their bandgaps include Gallium Nitride (3.4 eV), Silicon Carbide (3.26 eV) and Gallium Arsenide (1.424 eV). For comparison, the bandgap of silicon is 1.12 eV. In one approach, a high bandgap compound semiconductor has a bandgap of at least 1.2-1.4 eV or a bandgap which is higher than the bandgap of silicon. In another approach, semiconductors with bandgaps larger than 2 eV are said to have a high bandgap.

However, because of the incompatibility with CMOS logic circuits, it is difficult to perform current sensing for a power converter. For example, a voltage regulator on a motherboard may rely on an integrated current sensor that provides reliable, fast and accurate current monitoring information to a power management unit (PMU) for monitoring system health and power consumption. For power converters designed using non-CMOS-capable technology, it is often impractical to add an output current sensor due to the lack of availability of high-performance analog/logic circuits that are required to perform complex signal conditioning.

One possible solution is to perform current sensing at the input/output ports of the converter. However, this does not provide insight into the current levels through each of the switches in the power converter. This can result in the PMU missing critical markers that indicate excessive device stress, rapid aging and non-uniform current distribution in multi-phase/ganged designs. This can reduce overall lifetime and increase the number of failures in of the electronic device in the field.

The techniques disclosed herein address the above and other issues. In one aspect, an apparatus is provided which includes a power converter fabricated on a high bandgap semiconductor die and an associated current sensor which includes a first portion fabricated on the high bandgap semiconductor die and a second portion fabricated on a companion silicon die. For example, the power converter may be a buck converter which includes a high-side switching transistor and a low-side switching transistor.

In one approach, the current sensor measures a current corresponding to a current of the high-side switching transistor by providing a sense transistor on the high bandgap die which is a scaled down version of the high-side switching transistor. A feedback circuit on the silicon die regulates the current and a drain-to-source voltage of the sense transistor based on a drain-to-source voltage of the high-side switching transistor. The feedback circuit may include an integrated operation amplifier (op-amp). The current sensor may further include an averaging or sampling circuit to output a current which is representative of the current through the high-side switching transistor. The output current can be determined when the high-side switching transistor is turned on by a control signal of the buck converter.

In another approach, the current sensor measures a current corresponding to a current of the low-side switching transistor by providing a sense transistor on the high bandgap die which is a scaled down version of the low-side switching transistor. A feedback circuit regulates a current and a drain-to-source voltage of the sense transistor based on a drain-to-source voltage of the low-side switching transistor. The current sensor may further include an averaging or sampling circuit to output a current which is representative of the current through the low-side switching transistor. The output current can be determined when the low-side switching transistor is turned on by a control signal of the buck converter.

In another approach, the current sensor alternatingly measures currents through both the high-side and low-side switching transistors. An output current is determined based on a sum of the two currents over a switching cycle.

The high bandgap die and the silicon die may be packaged in a common package on a printed circuit board (PCB), for example. The addition of the current sensor advantageously does not require an additional silicon die since a silicon die with its CMOS circuits would already be used for high-frequency gate driving applications of the buck converter. The silicon die can support the addition of telemetry functions using high-density analog and logic circuits. The current sensor can also make use of either a gated averaging or a sampling technique to reduce the amount of routing needed between the high bandgap die and the silicon die.

Providing accurate current sensing in the buck converter or other voltage regulator helps the system keep track of power consumption and efficiency, while also protecting against device stress, rapid aging and non-uniform current distribution between multi-phase/ganged voltage regulator that can lead to reduced lifetime.

These and other features will be apparent in view of the following discussion.

FIG. 1 depicts an example implementation of a power converter 100 on a first die, Die1, which is driven by gate drivers 121 and 122 on a second die, Die2, in accordance with various embodiments. Die1 can be comprised of a high bandgap compound semiconductor such as GaN, SiC or GaAs, for example. Other high bandgap compound semiconductors or materials may be used. Die2 can be a silicon die. A compound semiconductor is a semiconductor that is made from two or more elements. In contrast, silicon is made from a single element. The two or more elements can be selected from two or more different groups in the periodic table, e.g., groups III-V.

In one possible example, the power converter 100 is a buck converter which includes a high-side switching transistor MH and a low-side switching transistor ML connected serially between a power supply node 140, which receives a power supply voltage Vin, and a ground node 129 at a voltage Vss, e.g., 0 V. These switching transistors are also referred to as power transistors. A switching node 128 at a voltage Vxbr is between the two transistors. The switching node is coupled by a path 135 to an inductive-capacitance (L-C) circuit 130 comprising an inductor L on a path 131 and a capacitor C on a path 132. The capacitor is in parallel with a resistive load, Rload, on a path 133.

The transistors are n-type Metal-Oxide-Semiconductor Field-Effect transistors (nMOSFETs) in this example, but other types of switching transistors could be used. For example, pMOSFETs could be used. Generally, a MOSFET had diffusion regions on either side of a gate. A diffusion region can act as a source or drain depending on the bias. For an nMOSFET, when referring to an electron current which flows from source to drain, the drain is the side which has a higher potential than the other side. For an nMOSFET, when referring to a hole current which flows from drain to source, the source is the side which has a higher potential than the other side. For a pMOSFET, when referring to an electron current which flows from source to drain, the source is the side which has a higher potential than the other side. For a pMOSFET, when referring to a hole current which flows from drain to source, the drain is the side which has a higher potential than the other side. The transistor symbols identify an nMOSFET by an arrow pointing from the body to the gate and a pMOSFET by an arrow pointing from the gate to the body.

In this example, MH has a control gate Gh, a drain Dh and a source Sh. The control gate of MH is coupled to a path 125 which is in turn coupled to an output of the gate driver 121. The coupling is a via a first ("1") interface 110 of Die2. Similarly, in this example, ML has a control gate Gl, a drain Dl and a source Sl. The control gate is coupled to a path 126 which in turn is coupled to an output of the gate driver 122. The coupling is a via a second ("2") interface 111 of Die2.

Figure 6A:
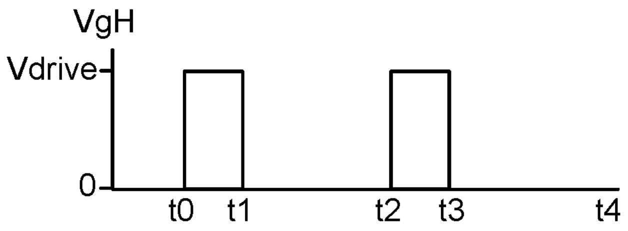
FIG. 6A depicts an example plot of a voltage signal used to drive MH and MHs in FIG. 2-4, in accordance with various embodiments.
Figure 6B:
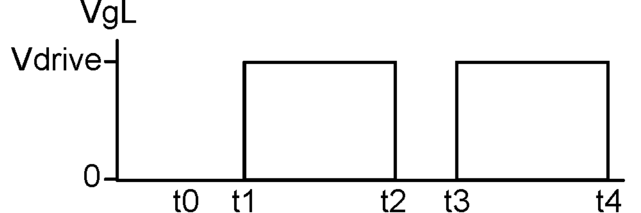
FIG. 6B depicts an example plot of a voltage signal used to drive ML and MLs in FIG. 2-4, in accordance with various embodiments.

As depicted as in FIGS. 6A and 6B, the gate driver 121 can output a time-varying control gate voltage VgH for MH, and the gate driver 122 outputs a time-varying control gate voltage VgL for ML. Generally, in a driving cycle, MH is turned on (made conductive) while ML is turned off (made non-conductive), after which MH is turned off while ML is turned on. When MH is turned on and ML is turned off, a current IH (arrow 142) is supplied to the LC circuit. See also FIG. 7A. The current through the inductor increases, charging the LC circuit. When ML is turned on and MH is turned off, a current Iss (arrow 141) is supplied to the LC circuit. See also FIG. 7B. The current through the inductor decreases, discharging the LC circuit. The L-C circuit thus undergoes repeated cycles of charging and discharging to provide an average voltage output at a desired level.

This example depicts a synchronous buck converter having integrated high-side and low-side switching transistors. Another type of buck converter is non-synchronous, and includes a high-side switching transistor integrated with a diode. The current sensor described below can be implemented with these and other types of power converters and circuits.

As mentioned, power converters designed using high-bandgap compound semiconductors can operate at higher efficiencies and higher frequencies compared to similar silicon-based implementations. This leads to better system performance and a smaller form factor, both for the switches as well as the passive components, and thus greater power density. However, high bandgap materials lack good complementary devices, thus making them unsuitable for integrating ancillary logic and sensing functions that power converters usually rely on for regulation and telemetry. Consequently, high bandgap-based voltage regulators can have functions such as regulation and gate driving implemented on a silicon CMOS IC that can be integrated on the platform or co-packaged. This is shown in FIG. 1, with a buck converter used as an example.

To accurately sense the current through the switching transistors, a sense transistor MHs or MLs can be used which has the same voltages across its terminals as MH or ML, respectively. The sense transistor can be configured to have the same voltages across its terminals as the corresponding switching transistor of the power converter. The sense transistor may also be a scaled down version of the switching transistor, having similar dimensions but in a scaled down format. The sense transistor may also be fabricated on Die1, the high-bandgap compound semiconductor, on which the switching transistor is fabricated. Or, the sense transistor may be fabricated on another die which is made of the same high-bandgap material. The sense transistor may be co-located with the switching transistor on Die1, e.g., located relatively closely to the switching transistor. A current which is sensed in the sense transistor will therefore be a scaled down version of the current in the switching transistor. For example, if a sense transistor is scaled down relative to a switching transistor by a scaling factor k, the current of the sense transistor is scaled down relative to a current of the switching transistor by the scaling factor.

Figure 2:
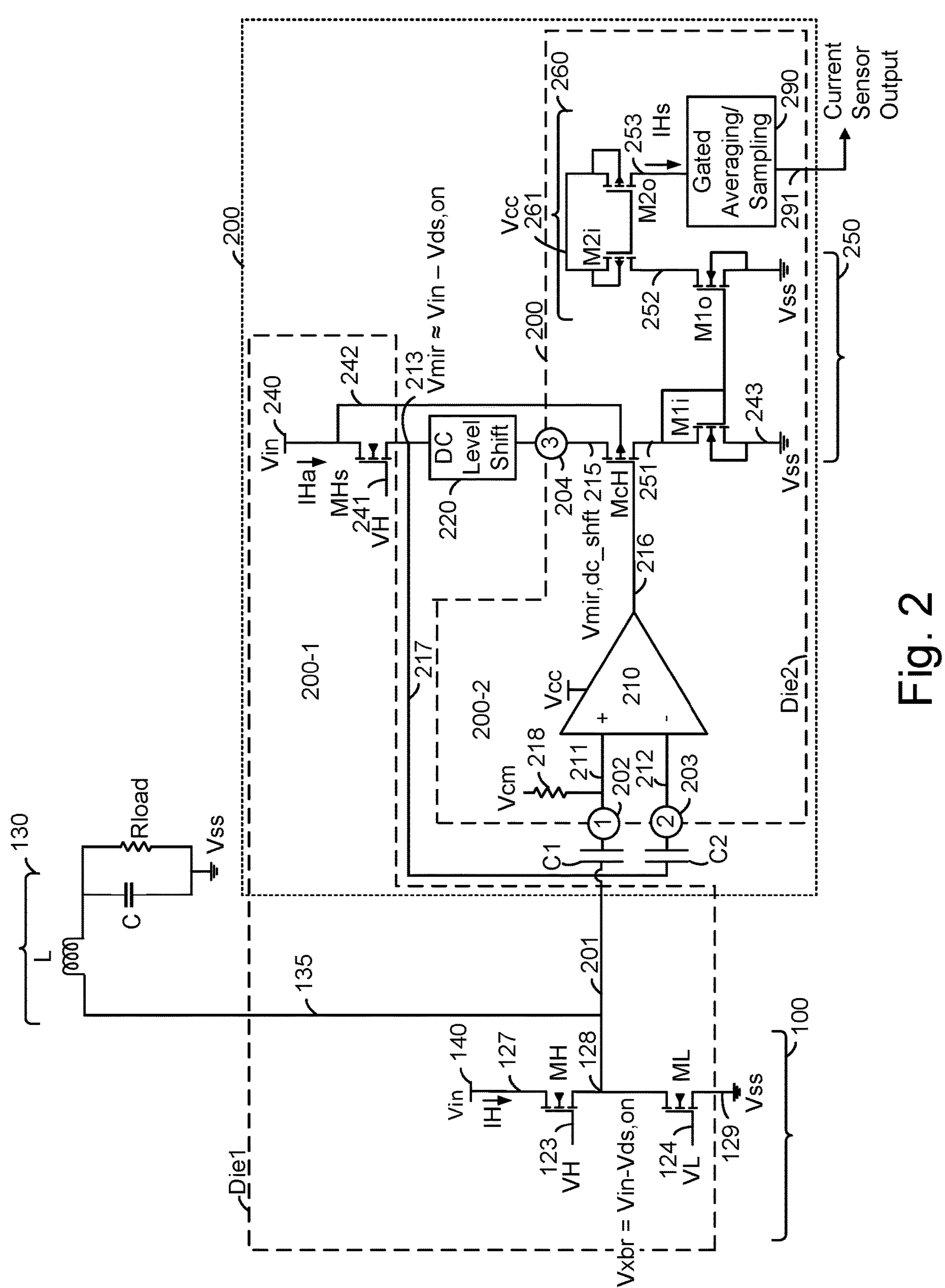
FIG. 2 depicts an example implementation of the power converter 100 of FIG. 1 on Die1 and a current sensor 200 comprising a first portion 200-1 on Die1 and a second portion 200-2 on Die2 of FIG. 1, where the current sensor senses a current corresponding to a current of the high-side switching transistor MH, in accordance with various embodiments.
Figure 3:
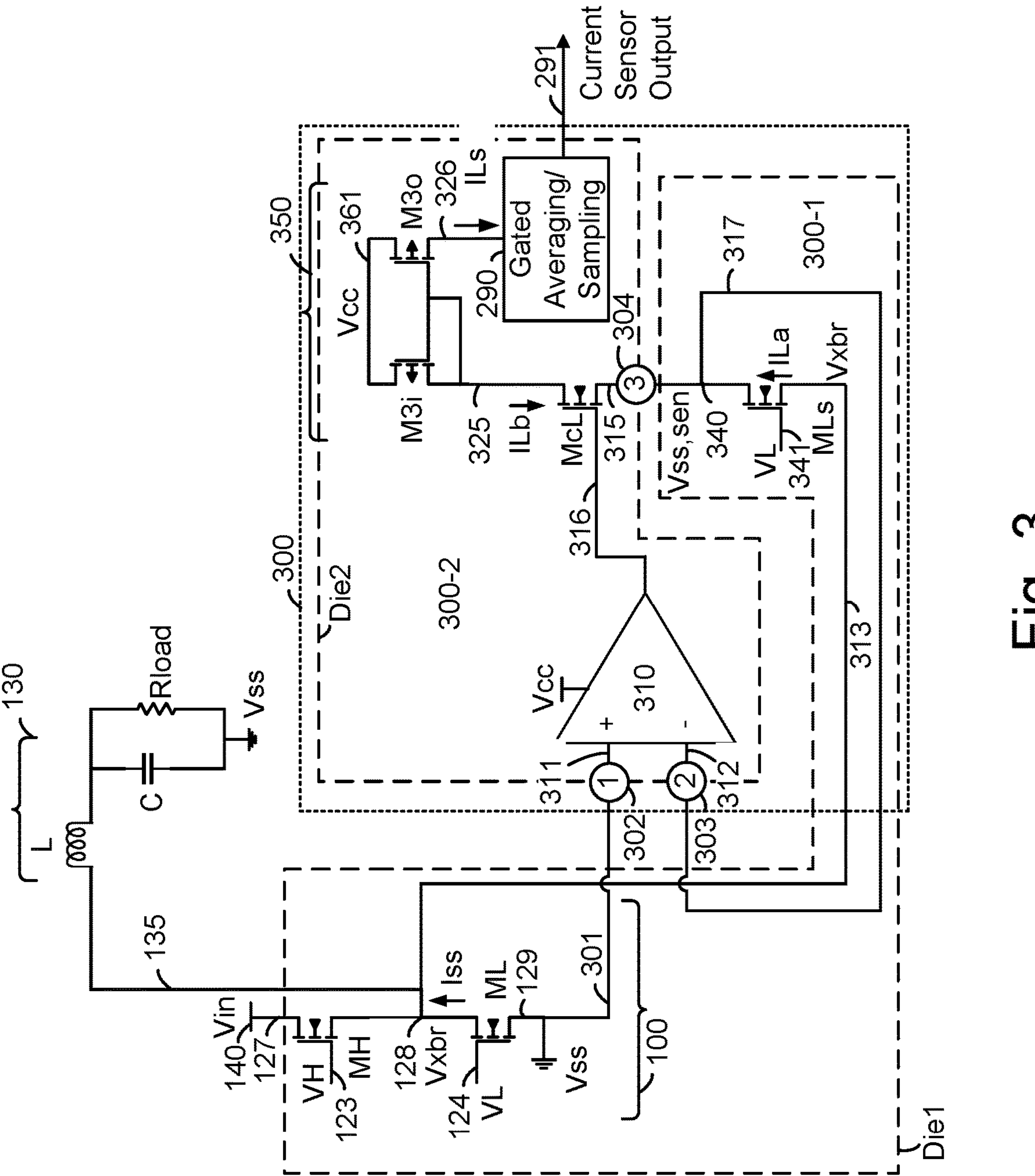
FIG. 3 depicts an example implementation of the power converter 100 of FIG. 1 on Die1 and a current sensor 300 comprising a first portion 300-1 on Die1 and a second portion 300-2 on Die2 of FIG. 1, where the current sensor senses a current corresponding to a current of the low-side switching transistor ML, in accordance with various embodiments.
Figure 4:
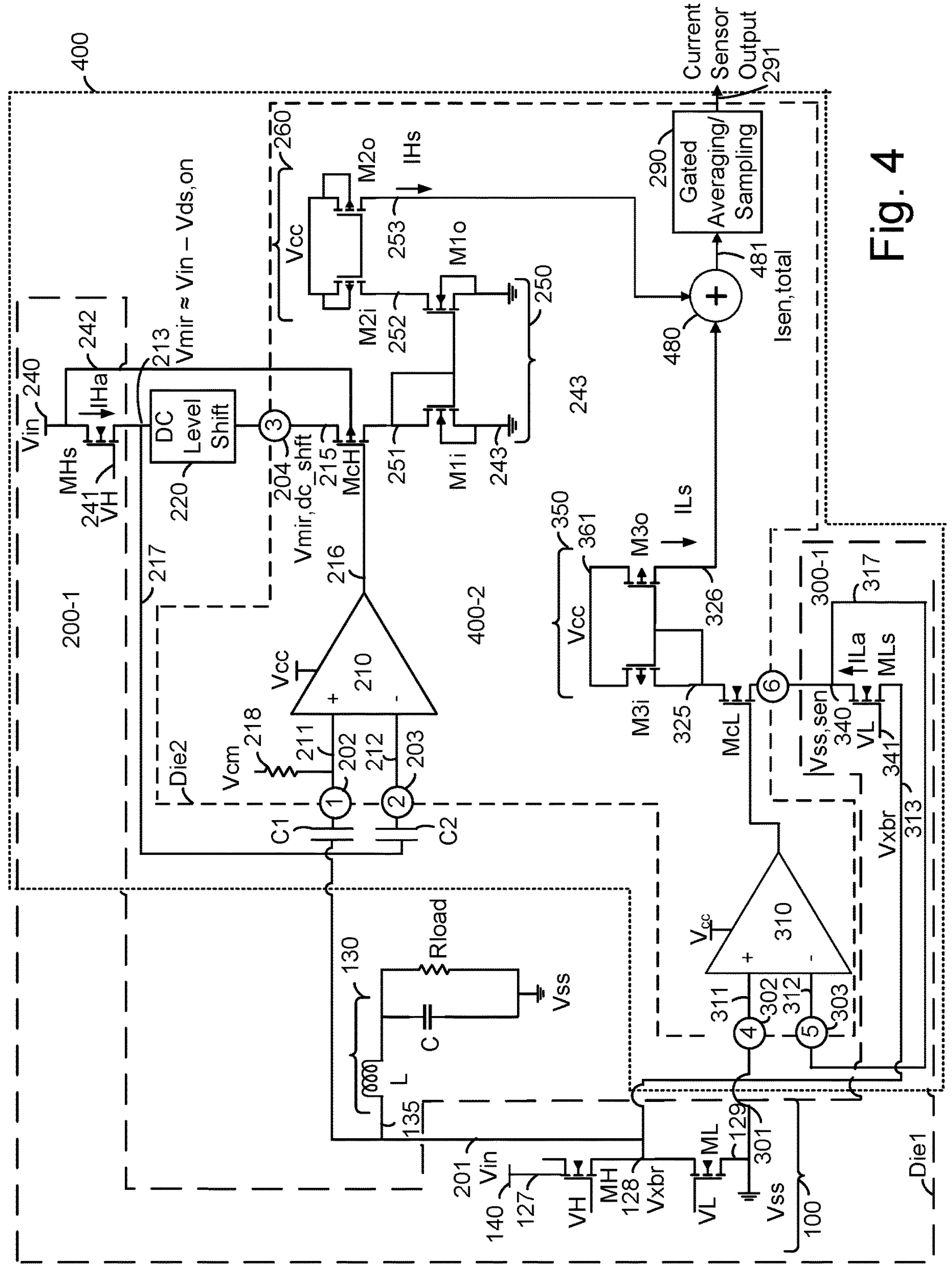
FIG. 4 depicts an example implementation of the power converter 100 of FIG. 1 on Die1 and a current sensor 400 comprising the first portions 200-1 and 300-1 on Die1 and a second portion 400-2 which combines the second portions 200-2 and 300-2 on Die2 of FIG. 1, where the current sensor senses currents corresponding to currents of ML and MH, in accordance with various embodiments.

The examples of FIG. 2-4 provide a current sensor in which a common gate voltage is applied to the sense transistor and the switching transistor such as by connecting their gate terminals to one another, and a common drain voltage is applied to the sense transistor and the switching transistor such as by connecting their drain terminals. For sensing MH using MHs, the common gate voltage is VgH and the common drain voltage is Vin. For sensing ML using MLs, the common gate voltage is VgL and the common drain voltage is Vxbr. Having common gate and drain voltages ensures the gate-to-drain voltage is equal. To ensure the drain-to-source voltage, Vds, and therefore the source voltage, is also equal for the sense and switching transistors, the current sensor can include a feedback loop with an amplifier which regulates the source voltage of the sense transistor. The term "equal" can indicate essentially equal, e.g., within a few percent such as within 1-5%. An output of the amplifier is coupled to the gate of a control transistor, McH or McL, which controls a current path of the sense transistor. By modulating the control transistor, the current, and the source voltage, of the sense transistor are modulated. With a fixed gate voltage VH and drain voltage Vin, it can also be said that the gate-to-source voltage and the drain-to-source voltage are modulated. The modulation of MH occurs when MH and MHs and turned on by VH and the modulation of MLs occurs when ML and MLs and turned on by VL.

The current sensor includes a portion on Die2 which is coupled to Die1 via a limited number of interface points on the die. For example, as depicted in FIGS. 2 and 3, a three-wire interface between the switching transistors on Die1 and a portion of the current sensor on Die2 can be sufficient to sense the current of the high or low side switching transistor. As depicted in FIG. 4, a six-wire interface between the switching transistors on Die1 and a portion of the current sensor on Die2 can be sufficient to sense the currents of the high and low side switching transistors.

FIG. 2 depicts an example implementation of the power converter 100 of FIG. 1 on Die1 and a current sensor 200 comprising a first portion 200-1 on Die1 and a second portion 200-2 on Die2 of FIG. 1, where the current sensor senses a current corresponding to a current of the high-side switching transistor MH, in accordance with various embodiments. In addition to including portions on Die1 and Die2, the current sensor can include optional capacitors C1 and C2. These components can be on Die2 if the die supports higher voltages that are close to Vin. Or, the capacitors can be off Die1 and Die2, as depicted, such as in a package or PCB. The current sensor also includes an optional DC level shifter 220 which can be on Die2, or off Die1 and Die2, as depicted, such as in a package or PCB on which Die1 and Die2 are attached.

The current sensor 200 has three interfaces 202, 203 and 204, which are points used for connecting to components outside Die2, such as the capacitors C1 and C2 and the DC level shifter 220, respectively. If the capacitors C1 and C2 are not used, the interfaces 202 and 203 can be used to directly couple to the paths 201 and 217, respectively. If the DC level shifter 220 is not used, the interface 204 can be used to directly couple to the node 213.

The portion 200-1 of the current sensor which is on Die1 includes MH. MH and MHs are both the same type of transistor, e.g., nMOSFETs, in this example. A drain side of MHs at the node 240 receives an input supply voltage, Vin, which is the same as Vin at node 140. A conductive path, not shown, may connect nodes 140 and 240. The node 240 is also coupled to the body of the pMOSFET control transistor McH via a path 242. In this example, the switching transistor MH comprises a high-side switching transistor of the power converter, and a polarity of the control transistor, e.g., p-type, is opposite to a polarity of the switching transistor, e.g., n-type.

A source side of MHs at a node 213 may be coupled to a DC level shifter 220. MHs receives a control gate voltage VH at a path 241, which is the same as VH on the path 123. A conductive path, not shown, may connect paths 123 and 241. MHs has a current path which extends from the node 240 to ground, at the node 243, and includes the node 213, the DC level shifter 220, the interface 204, the node 215, the control transistor McH, the path 251 and the transistor M1*i*. A current IHa flows in the current path.

The current sensor includes a feedback loop which adjusts a control gate voltage of the control transistor, McH, on a path 216, based on a difference between a voltage on a non-inverting input 211 and a voltage on an inverting input 212 of an amplifier 210. If the voltage at node 213 equals the voltage at node 201, e.g., the source voltage of MHs equals the source voltage of MH, and assuming the capacitors C1 and C2 provide an equal voltage drop, the voltage at the non-inverting input 211 will equal the voltage at the inverting input 212, and the voltage on the output path 216 will be at the output offset voltage of the amplifier. The output offset voltage is the voltage that appears at the output when the voltages at the two input terminals are equal. The output offset voltage is in addition to any output which is based on the gain multiplied by the differential input voltage. McH will therefore be conductive or in a turn on state. If the voltage at the node 201 is greater than at the node 213 and path 217, the voltage on the output path 216 will increase, so that the current in McH decreases. This increases the voltage at the node 213 and path 217 to match the voltage at the node 201. Similarly, if the voltage at the node 201 is less than at the node 213, the voltage on the output path 216 will decrease, so that the current in McH increases. This results in a decrease in the voltage at the node 213 and path 217 to match the voltage at the node 201.

On Die2, the feedback loop includes an amplifier 210, a feedback path 217, the output path 216 and the control transistor McH. Off Die2, the feedback loop can include the DC level shifter 220. The shifter is in the current path and keeps the amplifier output to a reasonable level, e.g., not too high. The DC level shifter can be realized using any circuit that offers a voltage-drop with low small-signal resistance, such as an appropriate number of forward-biased diodes.

The DC level shifter 220 reduces the voltage on node 213 to a lower voltage on node 215. The feedback path also includes a third interface 204 of Die2. The third interface couples the DC level shifter 220 to the node 215, at a source of McH. The portion 200-2 of the current sensor which is on Die2 further includes a first current mirror 250 and a second current mirror 260, e.g., one or more current mirrors. The first current mirror 250 includes an input path 251 with a transistor M1*i* in the current path of the sense transistor, and an output path 252 with a transistor M1*o*. The current on the path 251 is mirrored to the path 252. The second current mirror 260 is biased by a positive voltage, Vcc, at a node 261, and includes the path 252 as its input path and an output path 253 with a transistor M2*o*. The current on the path 252 is mirrored to the path 253. The output path 253 carries a current IHs which is provided to a gated averaging/sampling circuit 290. This circuit in turn provides a current sensor output (on the output path 291) which is a current representative of the current IH through MH. The current sensor output is also representative of the current IHs through MHs and may be the same as IHs. The gated averaging/sampling circuit 290 can perform at least one of averaging or sampling such as depicted by the circuits in FIGS. 5 and 8, respectively, for example.

The representative current of MH is measured when it is turned on, and the transistor ML is turned off, as in t0-t1 or t2-t3 of FIGS. 6A and 6B. At this time, a current IH flows on the path 127. See also FIG. 1. The voltage Vxbr at the node 128 is equal to Vin-Vds,on, where Vds,on is the drain-to-source voltage of MH when MH is turned on. Vxbr is provided on a path 201 to the capacitor C1 which in turn is coupled to the interface 202 of Die2. The interface 202 in turn is coupled to the non-inverting input 211 of the amplifier 210. The interface 203 of Die2 is coupled to the inverting input 212 on Die2 and to the off-die capacitor C2. The capacitors C1 and C2 reduce the voltage at the inputs of the amplifier to allow for a reduced size and power consumption of the amplifier. Vxbr is also provided to the L-C circuit 130 via the path 135, as discussed in connection with FIG. 1.

Since the voltages at the amplifier terminals are close to the input voltage, Vin, which can be relatively large, C1 and C2 can be provided as decoupling capacitors at the inputs of the amplifier, along with the resistor 218 at the non-inverting input 211, to set the common-mode voltage, Vcm, at the input terminals to a more amenable value.

With Vin and VH also applied to MHs, the voltage at the node 213 is Vmir≅Vin-Vds,on, where Vds,on is the drain-to-source voltage when MHs is on. The voltage at the node 215 is reduced by the DC level shifter to Vmir,dc_shft, a shifted version of Vmir. McH is a pMOSFET in this example, so that a 0 V gate voltage will turn the transistor on allowing the current to continue flowing in the current path toward the ground node 243. As the amplifier modulates its output on the path 216, McH modulates the source voltage of MHs so that it equals or closely corresponds to Vxbr, the source voltage of MH at the node 128.

FIG. 3 depicts an example implementation of the power converter 100 of FIG. 1 on Die1 and a current sensor 300 comprising a first portion 300-1 on Die1 and a second portion 300-2 on Die2 of FIG. 1, where the current sensor senses a current corresponding to a current of the low-side switching transistor ML, in accordance with various embodiments.

In this example, the capacitors C1 and C2 and the DC level shifter of FIG. 2 are generally not needed due to the lower voltages at the inputs of the amplifier 310. However, the capacitors and DC level shifter can be used if desired.

The current sensor 300 has three interfaces, e.g., interfaces 302, 303 and 304. The interfaces 302 and 303 can be used to directly couple to the paths 301 and 317, respectively. The interface 304 can be used to directly couple to the node 315 on Die2 and the node 340 on Die1.

The portion 300-1 of the current sensor which is on Die1 includes MLs. ML and MLs are both the same type of transistor, e.g., nMOSFETs, in this example. A source side of MLs at a node 340 may be coupled to the source of the control transistor McL. The drain side of McL is coupled to a voltage Vcc via a path 325 and a pMOSFET M3i. In this example, the switching transistor ML comprises a low-side switching transistor of the power converter, and a polarity of the control transistor is equal to a polarity of the switching transistor, e.g., the polarity is n-type. The path 325 is an input path of a current mirror 350, and a path 326 is an output path of the current mirror. The current on the path 325, ILb, is mirrored to the path 326. The node 340 and the path 317 are coupled to the inverting input 312. A drain side of MLs at a path 313 is coupled to Vxbr at the node 128. A current ILa flows in MLs.

MLs receives a control gate voltage VL at a path 341, which is the same as VL on the path 124. A conductive path, not shown, may connect paths 124 and 341.

The current sensor includes a feedback loop which adjusts a control gate voltage of the control transistor, McL, on a path 316, based on a difference between a voltage on the non-inverting input 311 and a voltage on the inverting input 312 of the amplifier 310. If the voltage at node 340, Vss,sen, equals the voltage at path 301, e.g., the source voltage of MLs equals the source voltage of ML, the voltage at the non-inverting input 311 will equal the voltage at the inverting input 312, and the voltage on the output path 316 will be at the output offset voltage of the amplifier. The output offset voltage is the voltage that appears at the output when the voltages at the two input terminals are equal. The output offset voltage is in addition to any output which is based on the gain multiplied by the differential input voltage. McL will therefore be conductive or in a turn on state. If the voltage at the path 301 is greater than at the node 340 and path 317, the voltage on the output path 316 will increase, so that the current in McL decreases. This results in an increase in the voltage at the node 340 and path 317 to match the voltage at the path 301. Similarly, if the voltage at the path 301 is less than at the node 340, the voltage on the output path 316 will decrease, so that the current in McL increases. This results in a decrease in the voltage at the node 340 and path 317 to match the voltage at the path 301.

On Die2, the feedback loop includes the amplifier 310, the feedback path 317, the output path 316 and the control transistor McL. The feedback path also includes a third interface 304 of Die2 which couples the node 340 to the node 315. A portion of the current sensor which is on Die2 further includes the current mirror 350. As mentioned, the current on the path 325 is mirrored to the path 326. The current mirror is biased by Vcc at a node 361. The output path 326 carries a current ILs to the gated averaging/sampling circuit 290. This circuit in turn provides a current sensor output (on the output path 291) which is a representative of the current Iss through ML. The current sensor output is also representative of the current ILb and may be the same as ILb.

The representative current of ML is measured when it is turned on, and the transistor MH is turned off, as in t1-t2 or t3-t4 of FIGS. 6A and 6B. At this time, a current Iss flows at the node 128. See also FIG. 1.

Vxbr is also provided to the L-C circuit 130 via the path 135, as discussed in connection with FIG. 1.

McL is an nMOSFET in this example, so that a 0 V gate voltage will turn the transistor off, preventing the flow of current. As the amplifier modulates its output on the path 316, McL modulates the source voltage of MLs.

In this implementation, the switch node of the buck converter, Vxbr, is common between ML and MLs. The feedback loop is used to create a sense or replica transistor (MLs) that is virtually shorted to Vss close to MLs, at the node 129. This implementation is shown without the AC-coupling capacitors. However, these can be added with a high-resistance bias to set the common-mode at the amplifier input similar to FIG. 2 depending on the topology chosen for the amplifier. As in the circuit of FIG. 2, the sensed current is mirrored to generate a current-mode output.

FIG. 4 depicts an example implementation of the power converter 100 of FIG. 1 on Die1 and a current sensor 400 comprising the first portions 200-1 and 300-1 on Die1 and a second portion 400-2 which combines the second portions 200-2 and 300-2 on Die2 of FIG. 1, where the current sensor senses currents corresponding to currents of ML and MH, in accordance with various embodiments. This example combines the circuits of FIGS. 2 and 3. The first portion 300-1 of FIG. 3 is repeated with MLs, and the first portion 200-1 of FIG. 2 is repeated with MHs. Additionally, the second portion 400-2 combines the second portion 200-2 of FIG. 2 and the second portion 300-2 of FIG. 3. The second portion 400-2 further includes an adder 480 to sum the current ILs on the path 326 with the current IHs on the path 253. The summation of these currents, Isen,total, on a path 481, is provided to the gated averaging/sampling circuit 290. This circuit in turn provides a current sensor output (on the output path 291) which is a current representative of the current IH through MH and the current IL through ML. The current sensor output is also representative of the ILs+IHs and may be the same as ILs+IHs.

In practice, when IH is measured, IL will be at or close to 0 A and when IL is measured, IH will be at or close to 0 A. This approach obtains an average representative current in one switching cycle based on the currents through both of the switching transistors, compared to the approaches of FIGS. 2 and 3 which obtain an average representative current through just one of the switching transistors. This approach is more complex than that of FIGS. 2 and 3. The approach of FIG. 3 is the most efficient as it does not involve the capacitors of DC level shifter.

Both the high-side and low-side switch current sensors are needed to obtain the complete inductor current waveform for a buck converter. This can require a 6-wire interface between the high bandgap die and the silicon die, as depicted in FIG. 4, which might not be practical for all applications. Instead, sensing the current across a single switching transistor can be sufficient if current sensing is used for applications such as telemetry and over-current protection.

Figure 5:
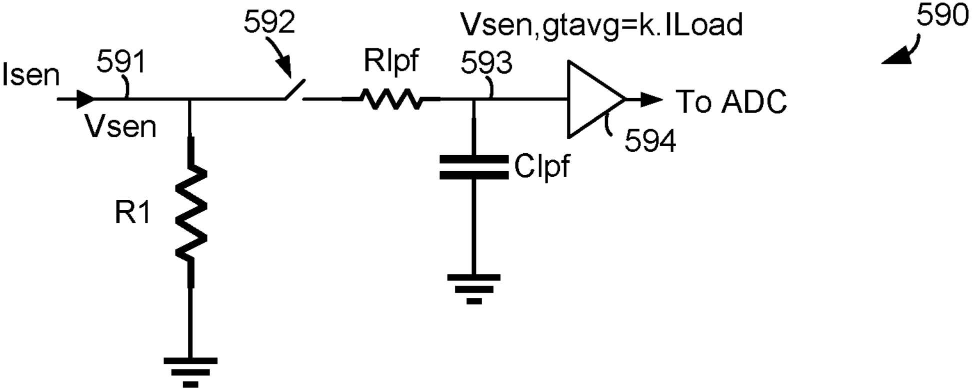
FIG. 5 depicts an example implementation of the gated averaging/sampling circuit 290 of FIG. 2-4, as an averaging circuit 590, in accordance with various embodiments.

FIG. 5 depicts an example implementation of the gated averaging/sampling circuit 290 of FIG. 2-4, as an averaging circuit 590, in accordance with various embodiments. Regardless of whether a representative current is sensed for one or both switching transistors, the sensed current can be processed at the gated averaging/sampling circuit 290. In this example, the averaging circuit 590 receives a sensed current, Isen, on a path 591. This sensed current can be IHs from FIG. 2, ILs from FIG. 3 or Isen,total from FIG. 4, for example. The sensed current is passed through a resistor R having a known resistance. The voltage across the resistor is then averaged using a low-pass filter which includes a resistor Rlpf, to provide a filtered voltage on a path 593. For IHs or ILs, the averaging function is gated by a switch 592 that is turned on (made conductive) or off (made non-conductive) when MH or ML, respectively, is turned on or off. For Isen,total, the switch can remain on throughout a switching cycle or be replaced by a non-switched path.

The gated average voltage, Vsen,gtavg, is proportional, by a factor k, to the average current, ILoad, through the inductor, and can be amplified at the amplifier 594 before being sent on to an analog ADC to provide a digital telemetry output. That is, Vsen,gtavg=k×ILoad. It can also be sent to an analog amplifier with voltage- or current-mode output, as required by a motherboard voltage regulator controller, such as an Intel Mobile Voltage Positioning (IMVP) or Intel VR13/VR14-compliant controller.

Additionally, since both the high-side and low-side sense current waveforms individually contain information about the peaks and valleys of the inductor current waveform, the sense voltage and/or current (pre-averaging) can be used to implement an over- or under-current protection capability.

FIG. 6A depicts an example plot of a voltage signal used to drive MH and MHs in FIG. 2-4, in accordance with various embodiments. FIG. 6A-7C depict one switching cycle of the power converter. In FIG. 6A, the vertical axis depicts VgH and the horizontal axis depicts time. VgH is high, at a drive voltage, Vdrive, from t0-t1 and t2-t3, and 0 V at other times.

FIG. 6B depicts an example plot of a voltage signal used to drive ML and MLs in FIG. 2-4, in accordance with various embodiments. The vertical axis depicts VgL and the horizontal axis depicts time. VgL is high, at Vdrive, from t1-t2 and t3-t4, and 0 V at other times. In some implementations, there is a small dead time, in which 0 V is applied, between the turn off of MH and the turn on of ML and between the turn off of ML and the turn on of MH.

Figure 7A:
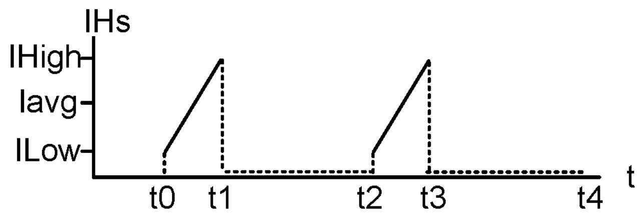
FIG. 7A depicts an example plot of a sensed current of MHs in FIGS. 2 and 4, in accordance with various embodiments.

FIG. 7A depicts an example plot of a sensed current of MHs in FIGS. 2 and 4, in accordance with various embodiments. The vertical axis depicts IHs and the horizontal axis depicts time. IHs ramps up from a low current ILow to a high current IHigh from t0-t1 and from t2-t3 and is 0 A at other times. The average current, Iavg, can be the average of ILow and IHigh, and can be determined each time MH is turned on. The current can be averaged each time MH is turned on, for example, or every nth time MH is turned on, where n=2 or more.

Figure 7B:
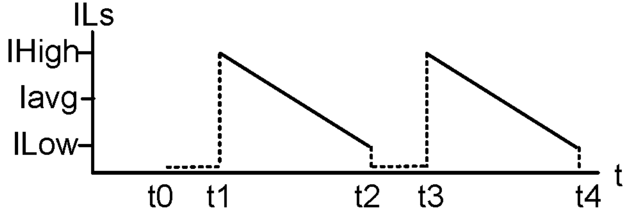
FIG. 7B depicts an example plot of a sensed current of MLs in FIGS. 3 and 4, in accordance with various embodiments.

FIG. 7B depicts an example plot of a sensed current of MLs in FIGS. 3 and 4, in accordance with various embodiments. The vertical axis depicts ILs and the horizontal axis depicts time. ILs ramps down from IHigh to ILow from t1-t2 and from t3-t4 and is 0 A at other times. The average current, Iavg, can be the average or midpoint of ILow and IHigh, and can be determined each time ML is turned on, in one approach. The current can be averaged each time ML is turned on, for example, or every nth time ML is turned on, where n=2 or more.

Figure 7C:
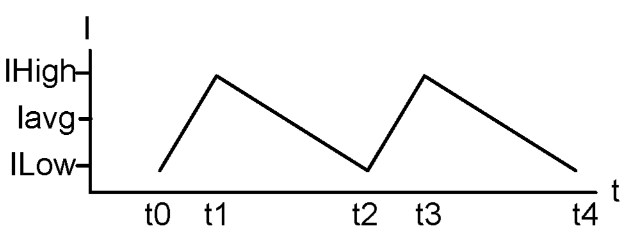
FIG. 7C depicts an example plot of a total sensed current, Isen,total, in FIG. 4, as a sum of the plots of FIGS. 7A and 7B, in accordance with various embodiments.

FIG. 7C depicts an example plot of a total sensed current, Isen,total, in FIG. 4, as a sum of the plots of FIGS. 7A and 7B, in accordance with various embodiments. The vertical axis depicts current, I, and the horizontal axis depicts time. The average current, Iavg, can be the average of ILow and IHigh, and can be determined once for each switching cycle, in one approach.

Figure 8:
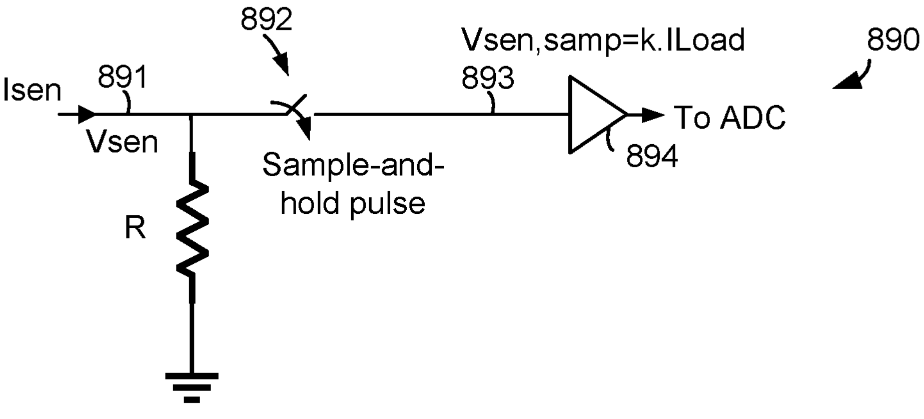
FIG. 8 depicts an example implementation of the gated averaging/sampling circuit 290 of FIG. 2-4, as a sampling circuit 890, in accordance with various embodiments.

FIG. 8 depicts an example implementation of the gated averaging/sampling circuit 290 of FIG. 2-4, as a sampling circuit 890, in accordance with various embodiments. In this example, the sampling circuit 890 receives a sensed current on a path 591. This sensed current can be IHs from FIG. 2, ILs from FIG. 3 or Isen,total from FIG. 4, for example. The sensed current, Isen, on a path 891 is passed through a resistor R having a known resistance. The voltage across the resistor is then sampled by a switch 892 using a sample-and-hold pulse from a controller. The sampled voltage is provided on a path 893. The sampling can be timed as depicted in FIGS. 9A and 9B, for example.

The sampled average voltage, Vsen,samp is proportional, by a factor k, to the average current, ILoad, through the inductor, and can be amplified at the amplifier 894 before being sent on to an analog ADC to provide a digital telemetry output. That is, Vsen,samp=k×ILoad.

Figure 9A:
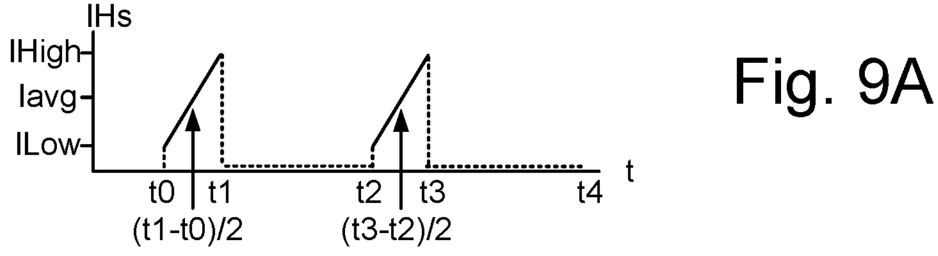
FIG. 9A depicts an example plot of a sampled current of MHs in FIGS. 2 and 4, in accordance with various embodiments.

FIG. 9A depicts an example plot of a sampled current of MHs in FIGS. 2 and 4, in accordance with various embodiments. FIGS. 9A and 9B depict one switching cycle. The vertical axis depicts IHs and the horizontal axis depicts time. IHs ramps up from ILow to IHigh from t0-t1 and from t2-t3 and is 0 A at other times. The current can be sampled at a midpoint between t0-t1 and t2-t3, in one approach. The current can be determined each time MH is turned on, for example, or every nth time MH is turned on, where n=2 or more. For example, the midpoint of t0-t1 is (t1-t0)/2 and the midpoint of t2-t3 is (t3-t2)/2.

Figure 9B:
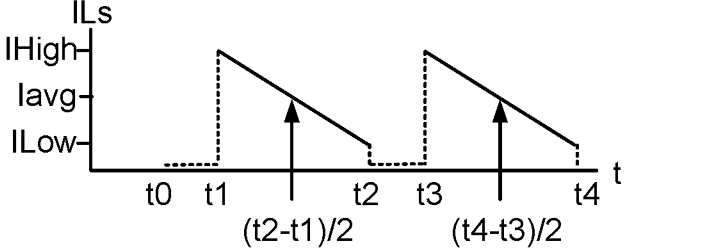
FIG. 9B depicts an example plot of a sampled current of MLs in FIGS. 3 and 4, in accordance with various embodiments.

FIG. 9B depicts an example plot of a sampled current of MLs in FIGS. 3 and 4, in accordance with various embodiments. The vertical axis depicts ILs and the horizontal axis depicts time. ILs ramps up from ILow to IHigh from t1-t2 and from t3-t4 and is 0 A at other times. The current can be sampled at a midpoint between t1-t2 and t3-t4, in one approach. For example, the midpoint of t1-t2 is (t2-t1)/2 and the midpoint of t3-t4 is (t4-t3)/2. The current can be determined each time ML is turned on, for example, or every nth time ML is turned on, where n=2 or more.

Sampling is an alternative to the gated averaging method. With sampling, the controller sends a narrow pulse or edge to the current sensor, denoting the mid-point of the low-side switch on-time. In the case of a digital controller generating a digitally controlled duty cycle for the gate drive, it just takes an additional output of the digital pulse-width modulation (DPWM) circuitry that has an edge denoting the mid-point of the low-side on-time.

Figure 10:
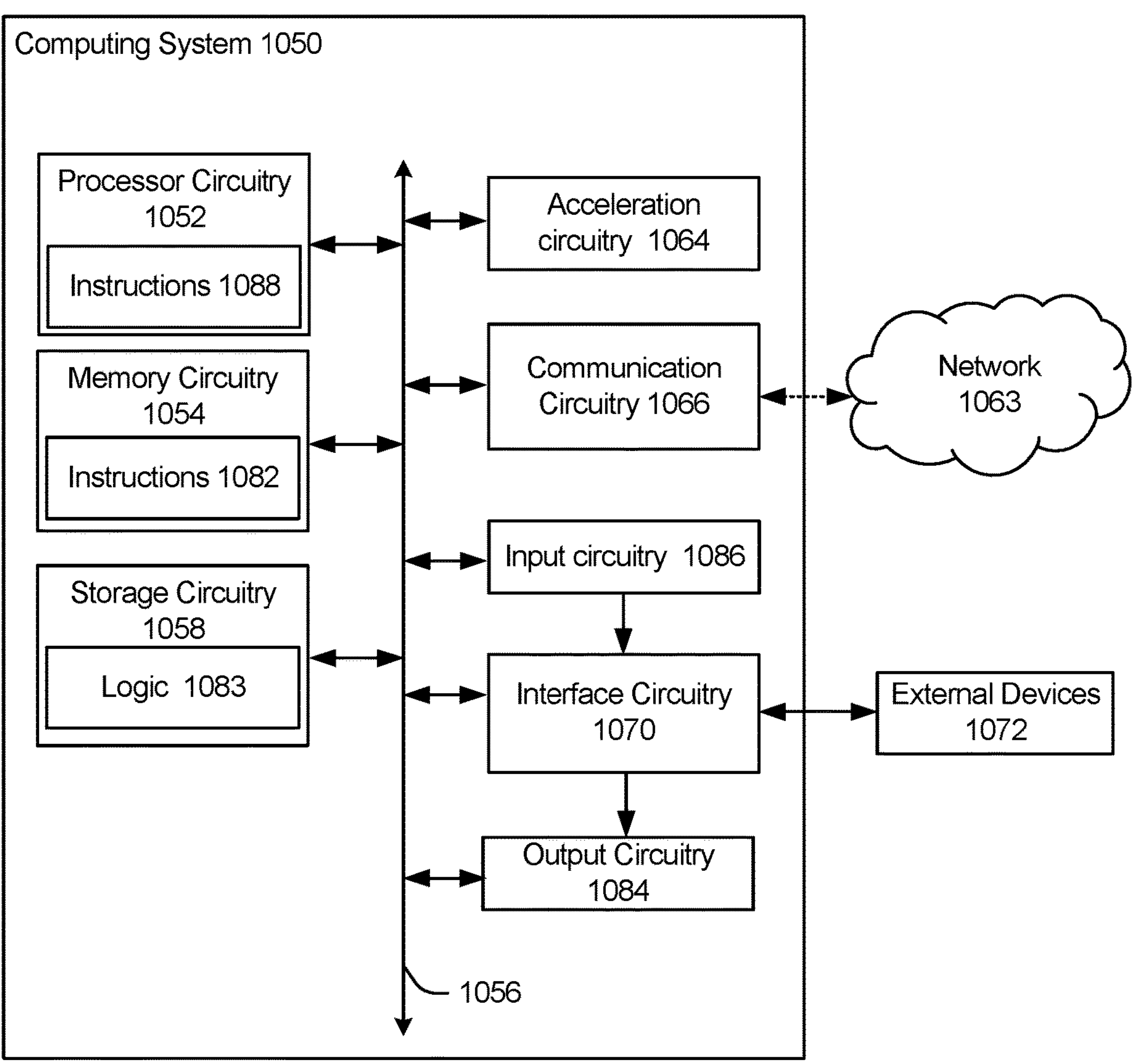
FIG. 10 illustrates an example of components that may be present in a computing system 1050 for implementing the techniques (e.g., operations, processes, methods, and methodologies) described herein.

FIG. 10 illustrates an example of components that may be present in a computing system 1050 for implementing the techniques (e.g., operations, processes, methods, and methodologies) described herein.

The computing system 1050 may include any combinations of the hardware or logical components referenced herein. The components may be implemented as ICs, portions thereof, discrete electronic devices, or other modules, instruction sets, programmable logic or algorithms, hardware, hardware accelerators, software, firmware, or a combination thereof adapted in the computing system 1050, or as components otherwise incorporated within a chassis of a larger system. For one embodiment, at least one processor 1052 may be packaged together with computational logic 1082 and configured to practice aspects of various example embodiments described herein to form a System in Package (SiP) or a System on Chip (SoC).

The system 1050 includes processor circuitry in the form of one or more processors 1052. The processor circuitry 1052 includes circuitry such as, but not limited to one or more processor cores and one or more of cache memory, low drop-out voltage regulators (LDOs), interrupt controllers, serial interfaces such as SPI, I2C or universal programmable serial interface circuit, real time clock (RTC), timer-counters including interval and watchdog timers, general purpose I/O, memory card controllers such as secure digital/multi-media card (SD/MMC) or similar, interfaces, mobile industry processor interface (MIPI) interfaces and Joint Test Access Group (JTAG) test access ports. In some implementations, the processor circuitry 1052 may include one or more hardware accelerators (e.g., same or similar to acceleration circuitry 1064), which may be microprocessors, programmable processing devices (e.g., FPGA, ASIC, etc.), or the like. The one or more accelerators may include, for example, computer vision and/or deep learning accelerators. In some implementations, the processor circuitry 1052 may include on-chip memory circuitry, which may include any suitable volatile and/or non-volatile memory, such as DRAM, SRAM, EPROM, EEPROM, Flash memory, solid-state memory, and/or any other type of memory device technology, such as those discussed herein.

The processor circuitry 1052 may include, for example, one or more processor cores (CPUs), application processors, GPUs, RISC processors, Acorn RISC Machine (ARM) processors, CISC processors, one or more DSPs, one or more FPGAs, one or more PLDs, one or more ASICs, one or more baseband processors, one or more radio-frequency integrated circuits (RFIC), one or more microprocessors or controllers, a multi-core processor, a multithreaded processor, an ultra-low voltage processor, an embedded processor, or any other known processing elements, or any suitable combination thereof. The processors (or cores) 1052 may be coupled with or may include memory/storage and may be configured to execute instructions stored in the memory/storage to enable various applications or operating systems to run on the platform 1050. The processors (or cores) 1052 is configured to operate application software to provide a specific service to a user of the platform 1050. In some embodiments, the processor(s) 1052 may be a special-purpose processor(s)/controller(s) configured (or configurable) to operate according to the various embodiments herein.

As examples, the processor(s) 1052 may include an Intel® Architecture Core™ based processor such as an i3, an i5, an i7, an i9 based processor; an Intel® microcontroller-based processor such as a Quark™, an Atom™, or other MCU-based processor; Pentium® processor(s), Xeon® processor(s), or another such processor available from Intel® Corporation, Santa Clara, California. However, any number other processors may be used, such as one or more of Advanced Micro Devices (AMD) Zen® Architecture such as Ryzen® or EPYC® processor(s), Accelerated Processing Units (APUs), MxGPUs, Epyc® processor(s), or the like; A5-A12 and/or S1-S4 processor(s) from Apple® Inc., Snapdragon™ or Centrig™ processor(s) from Qualcomm® Technologies, Inc., Texas Instruments, Inc.® Open Multimedia Applications Platform (OMAP)™ processor(s); a MIPS-based design from MIPS Technologies, Inc. such as MIPS Warrior M-class, Warrior I-class, and Warrior P-class processors; an ARM-based design licensed from ARM Holdings, Ltd., such as the ARM Cortex-A, Cortex-R, and Cortex-M family of processors; the ThunderX2® provided by Cavium™, Inc.; or the like. In some implementations, the processor(s) 1052 may be a part of a system on a chip (SoC), System-in-Package (SiP), a multi-chip package (MCP), and/or the like, in which the processor(s) 1052 and other components are formed into a single integrated circuit, or a single package, such as the Edison™ or Galileo™ SoC boards from Intel® Corporation. Other examples of the processor(s) 1052 are mentioned elsewhere in the present disclosure.

The system 1050 may include or be coupled to acceleration circuitry 1064, which may be embodied by one or more AI/ML accelerators, a neural compute stick, neuromorphic hardware, an FPGA, an arrangement of GPUs, one or more SoCs (including programmable SoCs), one or more CPUs, one or more digital signal processors, dedicated ASICs (including programmable ASICs), PLDs such as complex (CPLDs) or high complexity PLDs (HCPLDs), and/or other forms of specialized processors or circuitry designed to accomplish one or more specialized tasks. These tasks may include AI/ML processing (e.g., including training, inferencing, and classification operations), visual data processing, network data processing, object detection, rule analysis, or the like. In FPGA-based implementations, the acceleration circuitry 1064 may comprise logic blocks or logic fabric and other interconnected resources that may be programmed (configured) to perform various functions, such as the procedures, methods, functions, etc. of the various embodiments discussed herein. In such implementations, the acceleration circuitry 1064 may also include memory cells (e.g., EPROM, EEPROM, flash memory, static memory (e.g., SRAM, anti-fuses, etc.) used to store logic blocks, logic fabric, data, etc. in LUTs and the like.

In some implementations, the processor circuitry 1052 and/or acceleration circuitry 1064 may include hardware elements specifically tailored for machine learning and/or artificial intelligence (AI) functionality. In these implementations, the processor circuitry 1052 and/or acceleration circuitry 1064 may be, or may include, an AI engine chip that can run many different kinds of AI instruction sets once loaded with the appropriate weightings and training code. Additionally or alternatively, the processor circuitry 1052 and/or acceleration circuitry 1064 may be, or may include, AI accelerator(s), which may be one or more of the aforementioned hardware accelerators designed for hardware acceleration of AI applications. As examples, these processor(s) or accelerators may be a cluster of artificial intelligence (AI) GPUs, tensor processing units (TPUs) developed by Google® Inc., Real AI Processors (RAPs™) provided by AlphalCs®, Nervana™ Neural Network Processors (NNPs) provided by Intel® Corp., Intel® Movidius™ Myriad™ X Vision Processing Unit (VPU), NVIDIA® PX™ based GPUs, the NM500 chip provided by General Vision®, Hardware 3 provided by Tesla®, Inc., an Epiphany™ based processor provided by Adapteva®, or the like. In some embodiments, the processor circuitry 1052 and/or acceleration circuitry 1064 and/or hardware accelerator circuitry may be implemented as AI accelerating co-processor(s), such as the Hexagon 685 DSP provided by Qualcomm®, the PowerVR 2NX Neural Net Accelerator (NNA) provided by Imagination Technologies Limited®, the Neural Engine core within the Apple® A11 or A12 Bionic SoC, the Neural Processing Unit (NPU) within the HiSilicon Kirin 970 provided by Huawei®, and/or the like. In some hardware-based implementations, individual subsystems of system 1050 may be operated by the respective AI accelerating co-processor(s), AI GPUs, TPUs, or hardware accelerators (e.g., FPGAs, ASICs, DSPs, SoCs, etc.), etc., that are configured with appropriate logic blocks, bit stream(s), etc. to perform their respective functions.

The system 1050 also includes system memory 1054. Any number of memory devices may be used to provide for a given amount of system memory. As examples, the memory 1054 may be, or include, volatile memory such as random access memory (RAM), static RAM (SRAM), dynamic RAM (DRAM), synchronous DRAM (SDRAM), RAMBUS® Dynamic Random Access Memory (RDRAM®), and/or any other desired type of volatile memory device. Additionally or alternatively, the memory 1054 may be, or include, non-volatile memory such as read-only memory (ROM), erasable programmable ROM (EPROM), electrically erasable programmable (EEPROM), flash memory, non-volatile RAM, ferroelectric RAM, phase-change memory (PCM), flash memory, and/or any other desired type of non-volatile memory device. Access to the memory 1054 is controlled by a memory controller. The individual memory devices may be of any number of different package types such as single die package (SDP), dual die package (DDP) or quad die package (Q17P). Any number of other memory implementations may be used, such as dual inline memory modules (DIMMs) of different varieties including but not limited to microDIMMs or MiniDIMMs.

Storage circuitry 1058 provides persistent storage of information such as data, applications, operating systems and so forth. In an example, the storage 1058 may be implemented via a solid-state disk drive (SSDD) and/or high-speed electrically erasable memory (commonly referred to as "flash memory"). Other devices that may be used for the storage 1058 include flash memory cards, such as SD cards, microSD cards, XD picture cards, and the like, and USB flash drives. In an example, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, phase change RAM (PRAM), resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a Domain Wall (DW) and Spin Orbit Transfer (SOT) based device, a thyristor based memory device, a hard disk drive (HDD), micro HDD, of a combination thereof, and/or any other memory. The memory circuitry 1054 and/or storage circuitry 1058 may also incorporate three-dimensional (3D) cross-point (XPOINT) memories from Intel® and Micron®.

The memory circuitry 1054 and/or storage circuitry 1058 is/are configured to store computational logic 1083 in the form of software, firmware, microcode, or hardware-level instructions to implement the techniques described herein. The computational logic 1083 may be employed to store working copies and/or permanent copies of programming instructions, or data to create the programming instructions, for the operation of various components of system 1050 (e.g., drivers, libraries, application programming interfaces (APIs), etc.), an operating system of system 1050, one or more applications, and/or for carrying out the embodiments discussed herein. The computational logic 1083 may be stored or loaded into memory circuitry 1054 as instructions 1082, or data to create the instructions 1082, which are then accessed for execution by the processor circuitry 1052 to carry out the functions described herein. The processor circuitry 1052 and/or the acceleration circuitry 1064 accesses the memory circuitry 1054 and/or the storage circuitry 1058 over the interconnect (IX) 1056. The instructions 1082 direct the processor circuitry 1052 to perform a specific sequence or flow of actions, for example, as described with respect to flowchart(s) and block diagram(s) of operations and functionality depicted previously. The various elements may be implemented by assembler instructions supported by processor circuitry 1052 or high-level languages that may be compiled into instructions 1088, or data to create the instructions 1088, to be executed by the processor circuitry 1052. The permanent copy of the programming instructions may be placed into persistent storage devices of storage circuitry 1058 in the factory or in the field through, for example, a distribution medium (not shown), through a communication interface (e.g., from a distribution server (not shown)), over-the-air (OTA), or any combination thereof.

The IX 1056 couples the processor 1052 to communication circuitry 1066 for communications with other devices, such as a remote server (not shown) and the like. The communication circuitry 1066 is a hardware element, or collection of hardware elements, used to communicate over one or more networks 1063 and/or with other devices. In one example, communication circuitry 1066 is, or includes, transceiver circuitry configured to enable wireless communications using any number of frequencies and protocols such as, for example, the Institute of Electrical and Electronics Engineers (IEEE) 802.11 (and/or variants thereof), IEEE 802.23.4, Bluetooth® and/or Bluetooth® low energy (BLE), ZigBee®, LoRaWAN™ (Long Range Wide Area Network), a cellular protocol such as 3GPP LTE and/or Fifth Generation (5G)/New Radio (NR), and/or the like. Additionally or alternatively, communication circuitry 1066 is, or includes, one or more network interface controllers (NICs) to enable wired communication using, for example, an Ethernet connection, Controller Area Network (CAN), Local Interconnect Network (LIN), DeviceNet, ControlNet, Data Highway+, or PROFINET, among many others.

The IX 1056 also couples the processor 1052 to interface circuitry 1070 that is used to connect system 1050 with one or more external devices 1072. The external devices 1072 may include, for example, sensors, actuators, positioning circuitry (e.g., global navigation satellite system (GNSS)/Global Positioning System (GPS) circuitry), client devices, servers, network appliances (e.g., switches, hubs, routers, etc.), integrated photonics devices (e.g., optical neural network (ONN) integrated circuit (IC) and/or the like), and/or other like devices.

In some optional examples, various input/output (I/O) devices may be present within or connected to, the system 1050, which are referred to as input circuitry 1086 and output circuitry 1084 in FIG. 10. The input circuitry 1086 and output circuitry 1084 include one or more user interfaces designed to enable user interaction with the platform 1050 and/or peripheral component interfaces designed to enable peripheral component interaction with the platform 1050. Input circuitry 1086 may include any physical or virtual means for accepting an input including, inter alia, one or more physical or virtual buttons (e.g., a reset button), a physical keyboard, keypad, mouse, touchpad, touchscreen, microphones, scanner, headset, and/or the like. The output circuitry 1084 may be included to show information or otherwise convey information, such as sensor readings, actuator position(s), or other like information. Data and/or graphics may be displayed on one or more user interface components of the output circuitry 1084. Output circuitry 1084 may include any number and/or combinations of audio or visual display, including, inter alia, one or more simple visual outputs/indicators (e.g., binary status indicators (e.g., light emitting diodes (LEDs)) and multi-character visual outputs, or more complex outputs such as display devices or touchscreens (e.g., Liquid Crystal Displays (LCD), LED displays, quantum dot displays, projectors, etc.), with the output of characters, graphics, multimedia objects, and the like being generated or produced from the operation of the platform 1050. The output circuitry 1084 may also include speakers and/or other audio emitting devices, printer(s), and/or the like. Additionally or alternatively, sensor(s) may be used as the input circuitry 1084 (e.g., an image capture device, motion capture device, or the like) and one or more actuators may be used as the output device circuitry 1084 (e.g., an actuator to provide haptic feedback or the like). Peripheral component interfaces may include, but are not limited to, a non-volatile memory port, a USB port, an audio jack, a power supply interface, etc. In some embodiments, a display or console hardware, in the context of the present system, may be used to provide output and receive input of an edge computing system; to manage components or services of an edge computing system; identify a state of an edge computing component or service; or to conduct any other number of management or administration functions or service use cases.

The components of the system 1050 may communicate over the IX 1056. The IX 1056 may include any number of technologies, including ISA, extended ISA, I2C, SPI, point-to-point interfaces, power management bus (PMBus), PCI, PCIe, PCIx, Intel® UPI, Intel® Accelerator Link, Intel® CXL, CAPI, OpenCAPI, Intel® QPI, UPI, Intel® OPA IX, RapidIO™ system IXs, CCIX, Gen-Z Consortium IXs, a HyperTransport interconnect, NVLink provided by NVIDIA®, a Time-Trigger Protocol (TTP) system, a FlexRay system, PROFIBUS, and/or any number of other IX technologies. The IX 1056 may be a proprietary bus, for example, used in a SoC based system.

The number, capability, and/or capacity of the elements of system 1050 may vary, depending on whether computing system 1050 is used as a stationary computing device (e.g., a server computer in a data center, a workstation, a desktop computer, etc.) or a mobile computing device (e.g., a smartphone, tablet computing device, laptop computer, game console, IoT device, etc.). In various implementations, the computing device system 1050 may comprise one or more components of a data center, a desktop computer, a workstation, a laptop, a smartphone, a tablet, a digital camera, a smart appliance, a smart home hub, a network appliance, and/or any other device/system that processes data.

The techniques described herein can be performed partially or wholly by software or other instructions provided in a machine-readable storage medium (e.g., memory). The software is stored as processor-executable instructions (e.g., instructions to implement any other processes discussed herein). Instructions associated with the flowchart (and/or various embodiments) and executed to implement embodiments of the disclosed subject matter may be implemented as part of an operating system or a specific application, component, program, object, module, routine, or other sequence of instructions or organization of sequences of instructions.

The storage medium can be a tangible machine readable medium such as read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs)), among others.

The storage medium may be included, e.g., in a communication device, a computing device, a network device, a personal digital assistant, a manufacturing tool, a mobile communication device, a cellular phone, a notebook computer, a tablet, a game console, a set top box, an embedded system, a TV (television), or a personal desktop computer.

Some non-limiting examples of various embodiments are presented below.

Example 1 includes an apparatus, comprising: a power converter on a compound semiconductor die, the power converter comprises a switching transistor; and a current sensor comprising a first portion on the compound semiconductor die and a second portion on a silicon die, wherein the first portion comprises a sense transistor, and the second portion comprises an amplifier to control a current of the sense transistor based on a comparison of a voltage of the sense transistor to a voltage of the switching transistor.

Example 2 includes the apparatus of Example 1, wherein the second portion comprises a control transistor coupled to the sense transistor; the control transistor has a gate coupled to an output of the amplifier; and to control the current of the sense transistor, the amplifier is to control a voltage at the gate of the control transistor.

Example 3 includes the apparatus of Example 2, wherein the current sensor comprises one or more current mirrors; the control transistor is coupled to an input path of the one or more current mirrors; an output path of the one or more current mirrors is coupled to a current processing circuit; and the current processing circuit comprises at least one of an averaging circuit or a sampling circuit.

Example 4 includes the apparatus of Example 2 or 3, further comprising: a direct current level shifter coupled to the sense transistor and the control transistor.

Example 5 includes the apparatus of any of Examples 1-4, wherein the switching transistor comprises a low-side switching transistor of the power converter; and a polarity of the control transistor is equal to a polarity of the switching transistor.

Example 6 includes the apparatus of any of Examples 2-5, wherein: the switching transistor comprises a high-side switching transistor of the power converter; and a polarity of the control transistor is opposite to a polarity of the switching transistor.

Example 7 includes the apparatus of any of Examples 1-6, wherein: a current of the sense transistor is scaled down relative to a current of the switching transistor by a scaling factor.

Example 8 includes the apparatus of any of Examples 1-7, wherein: the current sensor is to apply a gate voltage to the sense transistor which is equal to a gate voltage of the switching transistor and to apply a drain voltage to the sense transistor which is equal to a drain voltage of the switching transistor.

Example 9 includes the apparatus of any of Examples 1-8, wherein: the compound semiconductor die comprises at least one of Gallium Nitride, Silicon Carbide or Gallium Arsenide.

Example 10 includes the apparatus of any of Examples 1-9, wherein: the compound semiconductor die has a bandgap greater than a bandgap of the silicon die.

Example 11 includes the apparatus of any of Examples 1-10, wherein: the silicon die comprises a gate driver for the switching transistor.

Example 12 includes the apparatus of any of Examples 1-11, wherein: the sense transistor is coupled to an inverting input of the amplifier; and the switching transistor is coupled to a non-inverting input of the amplifier.

Example 13 includes the apparatus of Example 12, wherein: the sense transistor is coupled to the inverting input of the amplifier via a first capacitor; and the switching transistor is coupled to the non-inverting input of the amplifier via a second capacitor.

Example 14 includes an apparatus, comprising: a first die comprising a power converter and a first sense transistor, wherein the first die has a bandgap greater than a bandgap of silicon; and a silicon die comprising: a first amplifier and a first control transistor, wherein the silicon die has a first interface to couple a non-inverting input of the first amplifier to a first node of the power converter; a second interface to couple an inverting input of the first amplifier to the first sense transistor; a third interface to couple the first control transistor to the first sense transistor, wherein the first amplifier, to modulate a voltage of the first sense transistor, is to modulate a control gate voltage of the first control transistor based on a voltage of the first node; and a current processing circuit to process a current of the first sense transistor.

Example 15 includes the apparatus of Example 14, wherein: a common control gate voltage is applied to the first sense transistor and a first switching transistor of the power converter; and a common drain voltage is applied to the first sense transistor and the first switching transistor of the power converter.

Example 16 includes the apparatus of Example 14 or 15, wherein: the power converter comprises a high-side switching transistor and a low-side switching transistor; and the current processing circuit is to process the current of the first sense transistor when the high-side switching transistor is turned on and the low-side switching transistor is turned off but not when the high-side switching transistor is turned off and the low-side switching transistor is turned on.

Example 17 includes the apparatus of any one of Examples 14-16, wherein: the power converter comprises a high-side switching transistor and a low-side switching transistor; and the current processing circuit is to process the current of the first sense transistor when the high-side switching transistor is turned off and the low-side switching transistor is turned on but not when the high-side switching transistor is turned on and the low-side switching transistor is turned off.

Example 18 includes the apparatus of any one of Examples 14-17, wherein: the first die further comprises a second sense transistor; and the silicon die further comprises: a second amplifier and a second control transistor, wherein the silicon die has a fourth interface to couple a non-inverting input of the second amplifier to a second node of the power converter; a fifth interface to couple an inverting input of the second amplifier to the second sense transistor; and a sixth interface to couple the second control transistor to the second sense transistor, wherein the second amplifier, to modulate a voltage of the second sense transistor, is to modulate a control gate voltage of the first control transistor based on a voltage of the second node, and the current processing circuit is to process a total current based on a sum of the current of the first sense transistor and a current of the second sense transistor.

Example 19 includes the apparatus of Example 18, wherein: the power converter comprises a high-side switching transistor and a low-side switching transistor; and the current processing circuit is to process the current of the first sense transistor when the high-side switching transistor is turned on and the low-side switching transistor is turned off and to process the current of the second sense transistor when the high-side switching transistor is turned off and the low-side switching transistor is turned on.

Example 20 includes a sense circuit, comprising: a sense transistor; a control transistor coupled to the sense circuit; an amplifier having an output coupled to the control transistor, a non-inverting input to couple to a switching node of a power converter and an inverting input to couple to the sense transistor; and a current processing circuit coupled to the control transistor, the current processing circuit is to provide an output which is representative of a current of the switching node.

Example 21 includes the apparatus of Example 20, wherein: the amplifier is in a feedback control loop of a voltage of the sense transistor.

Example 22 includes the apparatus of Example 20 or 21, wherein: the amplifier, control transistor and current processing circuit are on a silicon die; and the power converter is on a die having a bandgap greater than a bandgap of the silicon die.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus, comprising:

a power converter on a compound semiconductor die, the power converter comprises a switching transistor; and a current sensor comprising a first portion on the compound semiconductor die and a second portion on a silicon die, wherein the first portion comprises a sense transistor, and the second portion comprises an amplifier to control a current of the sense transistor based on a comparison of a voltage of the sense transistor to a voltage of the switching transistor, wherein the compound semiconductor die has a bandgap greater than a bandgap of the silicon die, wherein: the sense transistor is coupled to an inverting input of the amplifier; and the switching transistor is coupled to a non-inverting input of the amplifier.

2. The apparatus of claim 1, wherein:

the second portion comprises a control transistor coupled to the sense transistor;

the control transistor has a gate coupled to an output of the amplifier; and to control the current of the sense transistor, the amplifier is to control a voltage at the gate of the control transistor.

3. The apparatus of claim 2, wherein:

the current sensor comprises one or more current mirrors;

the control transistor is coupled to an input path of the one or more current mirrors;

an output path of the one or more current mirrors is coupled to a current processing circuit; and the current processing circuit comprises at least one of an averaging circuit or a sampling circuit.

4. The apparatus of claim 2, further comprising:

a direct current level shifter coupled to the sense transistor and the control transistor.

5. The apparatus of claim 2, wherein:

the switching transistor comprises a low-side switching transistor of the power converter; and a polarity of the control transistor is equal to a polarity of the switching transistor.

6. The apparatus of claim 2, wherein:

the switching transistor comprises a high-side switching transistor of the power converter; and a polarity of the control transistor is opposite to a polarity of the switching transistor.

7. The apparatus of claim 1, wherein:

a current of the sense transistor is scaled down relative to a current of the switching transistor by a scaling factor.

8. The apparatus of claim 1, wherein:

the current sensor is to apply a gate voltage to the sense transistor which is equal to a gate voltage of the switching transistor and to apply a drain voltage to the sense transistor which is equal to a drain voltage of the switching transistor.

9. The apparatus of claim 1, wherein:

the compound semiconductor die comprises at least one of Gallium Nitride, Silicon Carbide or Gallium Arsenide.

10. The apparatus of claim 1, wherein:

the silicon die comprises a gate driver for the switching transistor.

11. The apparatus of claim 1, wherein:

the sense transistor is coupled to the inverting input of the amplifier via a first capacitor; and the switching transistor is coupled to the non-inverting input of the amplifier via a second capacitor.

12. An apparatus, comprising:

a first die comprising a power converter and a first sense transistor, wherein the first die has a bandgap greater than a bandgap of silicon; and a silicon die comprising:

a first amplifier and a first control transistor, wherein the silicon die has a first interface to couple a non-inverting input of the first amplifier to a first node of the power converter;

a second interface to couple an inverting input of the first amplifier to the first sense transistor;

a third interface to couple the first control transistor to the first sense transistor, wherein the first amplifier, to modulate a voltage of the first sense transistor, is to modulate a control gate voltage of the first control transistor based on a voltage of the first node; and a current processing circuit to process a current of the first sense transistor.

13. The apparatus of claim 12, wherein:

a common control gate voltage is applied to the first sense transistor and a first switching transistor of the power converter; and a common drain voltage is applied to the first sense transistor and the first switching transistor of the power converter.

14. The apparatus of claim 12, wherein:

the power converter comprises a high-side switching transistor and a low-side switching transistor; and the current processing circuit is to process the current of the first sense transistor when the high-side switching transistor is turned on and the low-side switching transistor is turned off but not when the high-side switching transistor is turned off and the low-side switching transistor is turned on.

15. The apparatus of claim 12, wherein:

the power converter comprises a high-side switching transistor and a low-side switching transistor; and the current processing circuit is to process the current of the first sense transistor when the high-side switching transistor is turned off and the low-side switching transistor is turned on but not when the high-side switching transistor is turned on and the low-side switching transistor is turned off.

16. The apparatus of claim 12, wherein:

the first die further comprises a second sense transistor; and the silicon die further comprises:

a second amplifier and a second control transistor, wherein the silicon die has a fourth interface to couple a non-inverting input of the second amplifier to a second node of the power converter;

a fifth interface to couple an inverting input of the second amplifier to the second sense transistor; and a sixth interface to couple the second control transistor to the second sense transistor, wherein the second amplifier, to modulate a voltage of the second sense transistor, is to modulate a control gate voltage of the first control transistor based on a voltage of the second node, and the current processing circuit is to process a total current based on a sum of the current of the first sense transistor and a current of the second sense transistor.

17. The apparatus of claim 16, wherein:

the power converter comprises a high-side switching transistor and a low-side switching transistor; and the current processing circuit is to process the current of the first sense transistor when the high-side switching transistor is turned on and the low-side switching transistor is turned off and to process the current of the second sense transistor when the high-side switching transistor is turned off and the low-side switching transistor is turned on.

18. A sense circuit, comprising:

a sense transistor;

a control transistor coupled to the sense circuit;

an amplifier having an output coupled to the control transistor, a non-inverting input to couple to a switching node of a power converter and an inverting input to couple to the sense transistor; and a current processing circuit coupled to the control transistor, the current processing circuit is to provide an output which is representative of a current of the switching node, wherein:

the amplifier, control transistor and current processing circuit are on a silicon die; and the power converter is on a die having a bandgap greater than a bandgap of the silicon die.

19. The sense circuit of claim 18, wherein:

the amplifier is in a feedback control loop of a voltage of the sense transistor.

* * * * *